United States Patent
Unno et al.

(10) Patent No.: US 10,566,218 B2
(45) Date of Patent: Feb. 18, 2020

(54) CERAMIC HEATER

(71) Applicant: NGK INSULATORS, LTD., Nagoya (JP)

(72) Inventors: Yutaka Unno, Handa (JP); Hiroshi Takebayashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/909,040

(22) Filed: Mar. 1, 2018

(65) Prior Publication Data

US 2018/0204748 A1 Jul. 19, 2018

Related U.S. Application Data

(63) Continuation of application No. PCT/JP2017/028835, filed on Aug. 8, 2017.

(60) Provisional application No. 62/372,869, filed on Aug. 10, 2016.

(51) Int. Cl.
| | |
|---|---|
| *H01L 21/67* | (2006.01) |
| *H01L 21/687* | (2006.01) |
| *H05B 3/28* | (2006.01) |
| *H05B 3/74* | (2006.01) |

(52) U.S. Cl.
CPC .. *H01L 21/67103* (2013.01); *H01L 21/68792* (2013.01); *H05B 3/283* (2013.01); *H05B 3/74* (2013.01); *H05B 2203/002* (2013.01); *H05B 2203/013* (2013.01)

(58) Field of Classification Search
CPC ......... H01L 21/67103; H01L 21/68792; H01L 21/67101; H01L 21/67115; H01L 21/67098; H01L 21/6715; H01L 21/6831; H05B 3/283; H05B 3/74; H05B 2203/013; H05B 2203/002
See application file for complete search history.

(56) References Cited

U.S. PATENT DOCUMENTS

| | | | | |
|---|---|---|---|---|
| 5,968,379 | A | * 10/1999 | Zhao | ................. C23C 16/45565 |
| | | | | 118/723 I |
| 9,984,866 | B2 | * 5/2018 | Elliot | ................ H01L 21/02002 |
| 2013/0248509 | A1 | 9/2013 | Unno et al. | |

FOREIGN PATENT DOCUMENTS

| | | | |
|---|---|---|---|
| JP | 2005-026120 | * | 1/2005 |
| JP | 2005-026120 A1 | | 1/2005 |
| JP | 2007-088484 A1 | | 4/2007 |

(Continued)

OTHER PUBLICATIONS

International Search Report and Written Opinion (Application No. PCT/JP2017/028835) dated Nov. 7, 2017.

(Continued)

*Primary Examiner* — Shawntina T Fuqua
(74) *Attorney, Agent, or Firm* — Burr & Brown, PLLC (57) ABSTRACT

A ceramic heater includes a disk-shaped ceramic plate with an upper surface defining a wafer placement surface on which a wafer is to be placed. One or more inner-peripheral-side heater elements are embedded in an inner peripheral zone of the ceramic plate, and one or more outer-peripheral-side heater elements are embedded in an outer peripheral zone of the ceramic plate. A thickness of the ceramic plate in a predetermined zone is 3.9% or less of a diameter of the ceramic plate. The predetermined zone is a zone including a boundary line between the inner peripheral zone and the outer peripheral zone.

6 Claims, 10 Drawing Sheets

(56) References Cited

FOREIGN PATENT DOCUMENTS

KR    10-2013-0107229 A    10/2013

OTHER PUBLICATIONS

English translation of International Preliminary Report on Patentability (Chapter I) (Application No. PCT/JP2017/028835) dated Feb. 21, 2019.
Korean Office Action (with English translation), Korean Application No. 10-2018-7006957, dated Sep. 2, 2019.

* cited by examiner

| Shape of plate (indicate a section of right half from a center) | Thickness of a main plate portion t (mm) [Thickness of a thinned portion t' (mm)] | Thickness t/ Diameter φ (%) [Thickness t'/ Diameter φ (%)] | Temperature difference between a center of a plate and a temperature boundary | Evaluation result |
|---|---|---|---|---|
| Experimental Example 1  | 13 | 3.9 | 3.0 | Good |
| Experimental Example 2  | 11 | 3.3 | 2.7 | Good |
| Experimental Example 3  | 9 | 2.7 | 2.2 | Good |
| Experimental Example 4  | 6 | 1.8 | 1.4 | Good |
| Experimental Example 5  | 19 | 5.8 | 4.9 | Not good |
| Experimental Example 6  | 15 | 4.5 | 3.8 | Not good |
| Experimental Example 7  | 11 [8] | 3.3 [2.4] | 2.0 | Good |
| Experimental Example 8  | 11 [8] | 3.3 [2.4] | 1.7 | Good |

| Shape of plate (indicate a section of right half from a center) | Thickness of a main plate portion t(mm) [Thickness of a thinned portion t'(mm)] | Thickness t/ Diameter φ (%) [Thickness t'/ Diameter φ (%)] | Temperature difference between a center of a plate and a temperature boundary | Evaluation result |
|---|---|---|---|---|
| Experimental Example 6 | 15 | 4.5 | 3.8 | Not good |
| Experimental Example 9 | 15 [10] | 4.5 [3.0] | 3.0 | Good |
| Experimental Example 10 | 15 [10] | 4.5 [3.0] | 2.8 | Good |

Fig. 13

CERAMIC HEATER

This application is based on and claims priority of U.S. Provisional Patent Application No. 62/372,869, filed on Aug. 10, 2016, the entire contents of which are incorporated herein by reference.

BACKGROUND OF THE INVENTION

1. Field of the Invention

The present invention relates to a ceramic heater.

2. Description of the Related Art

There is so far known a ceramic heater including a disk-shaped ceramic plate with an upper surface defining a wafer placement surface on which a wafer is to be placed. In one known example of that type ceramic heater, an inner-peripheral-side heater element is embedded in an inner peripheral zone of the ceramic plate, and an outer-peripheral-side heater element is embedded in an outer peripheral zone of the ceramic plate (see, e.g., PTL 1).

CITATION LIST

Patent Literature

PTL 1: Japanese Unexamined Patent Application Publication No. 2007-88484

SUMMARY OF THE INVENTION

In a process of performing plasma treatment as surface treatment of a wafer by employing the disk-shaped ceramic plate of PTL 1, wafer heating temperature and temperature uniformity in a wafer surface affect properties of a formed coating and properties of the wafer surface after being etched, thus affecting characteristics and yields of semiconductor devices. When plasma treatment is performed as surface treatment of a wafer, the wafer is heated by not only the ceramic plate, but also plasma, and the wafer is subjected to a gas flow distribution applied from a shower plate that is positioned above the ceramic plate. In the wafer under the plasma surface treatment, therefore, temperature in an outer zone is lower (or higher) than in a central zone. Accordingly, to keep uniform temperature in the wafer surface under the plasma treatment, the ceramic heater is needed to have such a temperature gradient profile that a temperature distribution in a central zone of the wafer placed on the wafer placement surface is substantially flat in a state not under the plasma treatment, and that a temperature distribution in the outer zone of the wafer outside the central zone gives temperature gradually rising (or lowering) toward an outer periphery.

However, the ceramic heater having the above temperature gradient profile, i.e., the profile that the temperature distribution in the central zone of the wafer is substantially flat and the temperature distribution in the outer zone of the wafer outside the central zone gives temperature gradually rising (or lowering) toward the outer periphery, has not been put into practice because a difficulty in manufacturing is high and a damage risk accompanies due to thermal conduction occurred inside the ceramic heater.

The present invention has been made to solve the above-mentioned problem, and its main object is to provide a ceramic heater having such a temperature gradient profile that in a state not under plasma treatment, a temperature distribution in a central zone of a wafer placed on a wafer placement surface is substantially flat, and that a temperature distribution in an outer zone of the wafer outside the central zone gives a temperature difference gradually increasing toward an outer periphery.

The present invention provides a ceramic heater including a disk-shaped ceramic plate with an upper surface defining a wafer placement surface on which a wafer is to be placed, one or more inner-peripheral-side heater elements embedded in an inner peripheral zone of the ceramic plate, and one or more outer-peripheral-side heater elements embedded in an outer peripheral zone of the ceramic plate, wherein a thickness of the ceramic plate in a predetermined zone is 3.9% or less of a diameter of the ceramic plate, and the predetermined zone is a zone including a zone boundary line between the inner peripheral zone and the outer peripheral zone.

With the ceramic heater described above, when the inner-peripheral-side heater elements and the outer-peripheral-side heater elements are controlled such that a predetermined temperature difference is held between a center and an outer periphery of the wafer placed on the wafer placement surface in a state not under plasma treatment, a temperature gradient profile can be obtained in which a temperature distribution in a zone (temperature-boundary inside zone) of the wafer inside a temperature-boundary line is nearly flat, and in which a temperature distribution in a zone (temperature-boundary outside zone) of the wafer outside the temperature-boundary line gives temperature gradually rising (or lowering) toward an outer periphery. The temperature boundary line is a line concentric to the ceramic plate, and a diameter of the concentric line is set to 54.5% of that of the ceramic plate.

In the ceramic heater of the present invention, the predetermined zone may be a zone spanning from an outer periphery of the ceramic plate to the inner side beyond the zone boundary line. With that feature, advantageous effects of the present invention can be more effectively obtained.

In the ceramic heater of the present invention, a shaft joint portion joined to a shaft may be provided in a region of the inner peripheral zone near a center, and the predetermined zone may be an entire zone of the ceramic plate outside the shaft joint portion. With those features, the advantageous effects of the present invention can be even more effectively obtained.

In the ceramic heater of the present invention, the thickness of the ceramic plate in the predetermined zone is preferably 3.3% or less of the diameter of the ceramic plate. With that feature, the advantageous effects of the present invention can be markedly obtained.

In the ceramic heater of the present invention, the thickness of the ceramic plate in the predetermined zone is preferably 1.8% or more of the diameter of the ceramic plate. With that feature, sufficient strength of the ceramic heater can be ensured.

In the ceramic heater of the present invention, the zone boundary line may be a circle concentric to the ceramic plate, and a diameter of the concentric circle may be set to a range of 75 to 85% of the diameter of the ceramic plate. With those features, the temperature distribution in a central region of the wafer can be made more nearly flat.

In the ceramic heater of the present invention, a non-heated zone including no heater elements may be provided between the inner peripheral zone and the outer peripheral zone. With that feature, because the non-heated zone has large heat resistance, the temperature distribution in the temperature-boundary inside zone of the wafer is less affected by the outer-peripheral-side heater elements. Therefore, the temperature distribution in the central zone of the wafer can be made more nearly flat. The non-heated zone is preferably an annular zone having a width in a range of 4.0% or more and 7.6% or less of the diameter of the ceramic plate.

In the ceramic heater of the present invention, a thinned portion including an annular groove or recessed step may be provided within the outer peripheral zone in the surface of the ceramic plate on the opposite side to the wafer placement surface. With that feature, because the thinned portion including the annular groove or recessed step has large heat resistance, the temperature distribution in the temperature-boundary inside zone of the wafer is less affected by the outer-peripheral-side heater elements.

The thinned portion may be provided in the non-heated zone including no heater elements. With that feature, because the thinned portion has larger heat resistance, the temperature distribution in the temperature-boundary inside zone of the wafer is even less affected by the outer-peripheral-side heater elements.

DETAILED DESCRIPTION OF THE INVENTION

Figure 1:
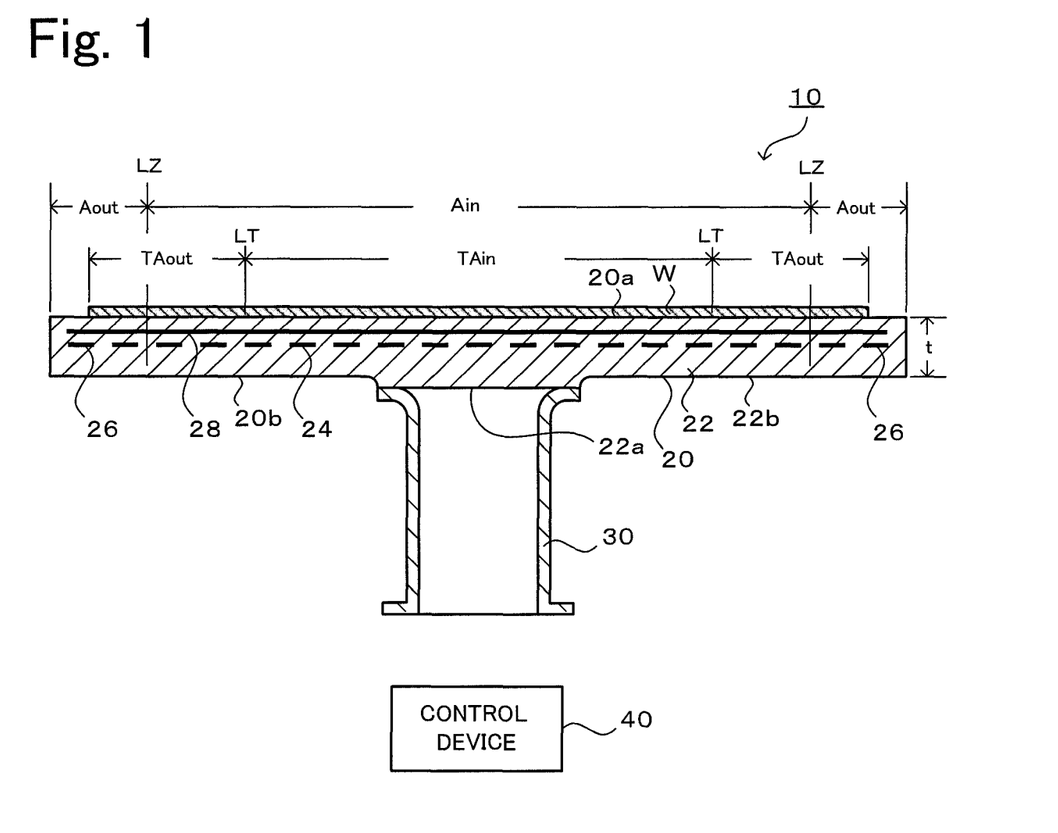
FIG. 1 is a vertical sectional view of ancillary equipment 10 for a semiconductor manufacturing apparatus.
Figure 2:
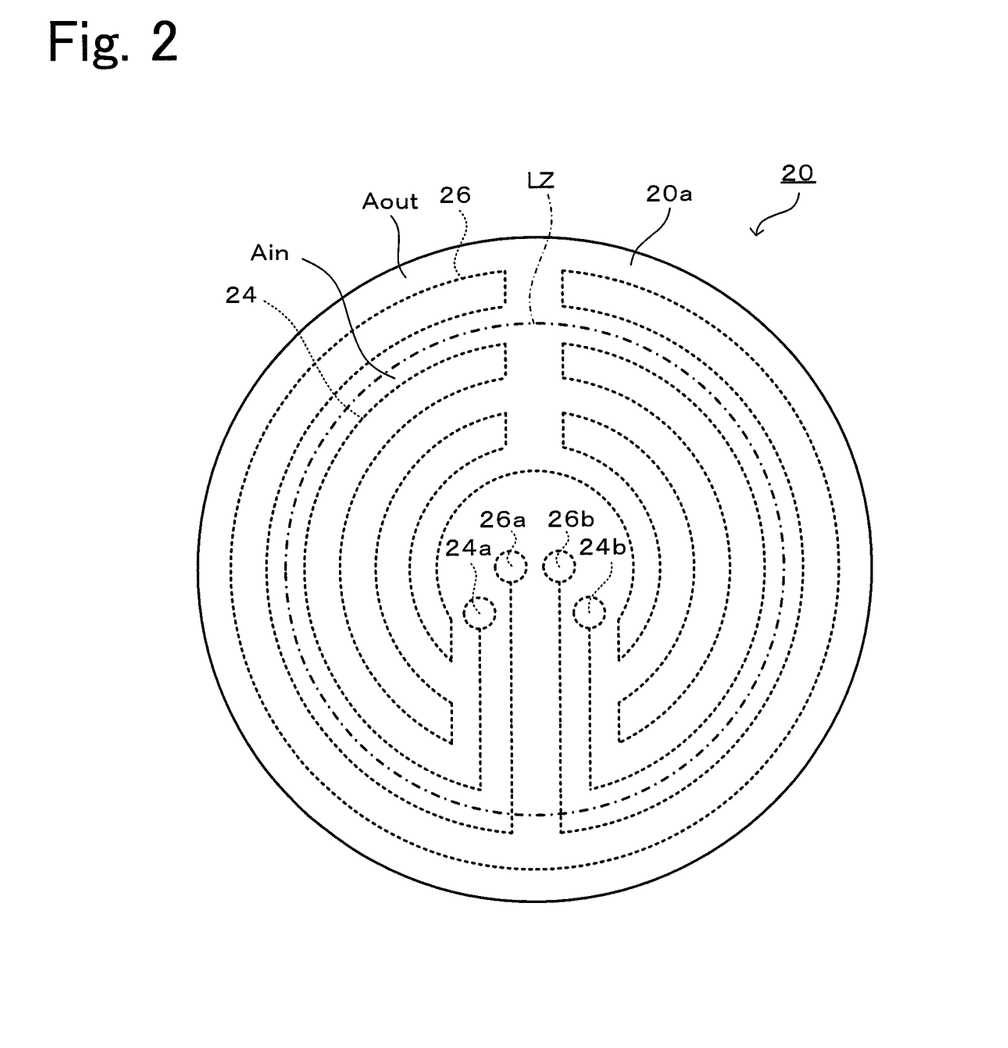
FIG. 2 is a plan view of a ceramic heater 20.
Figure 3:
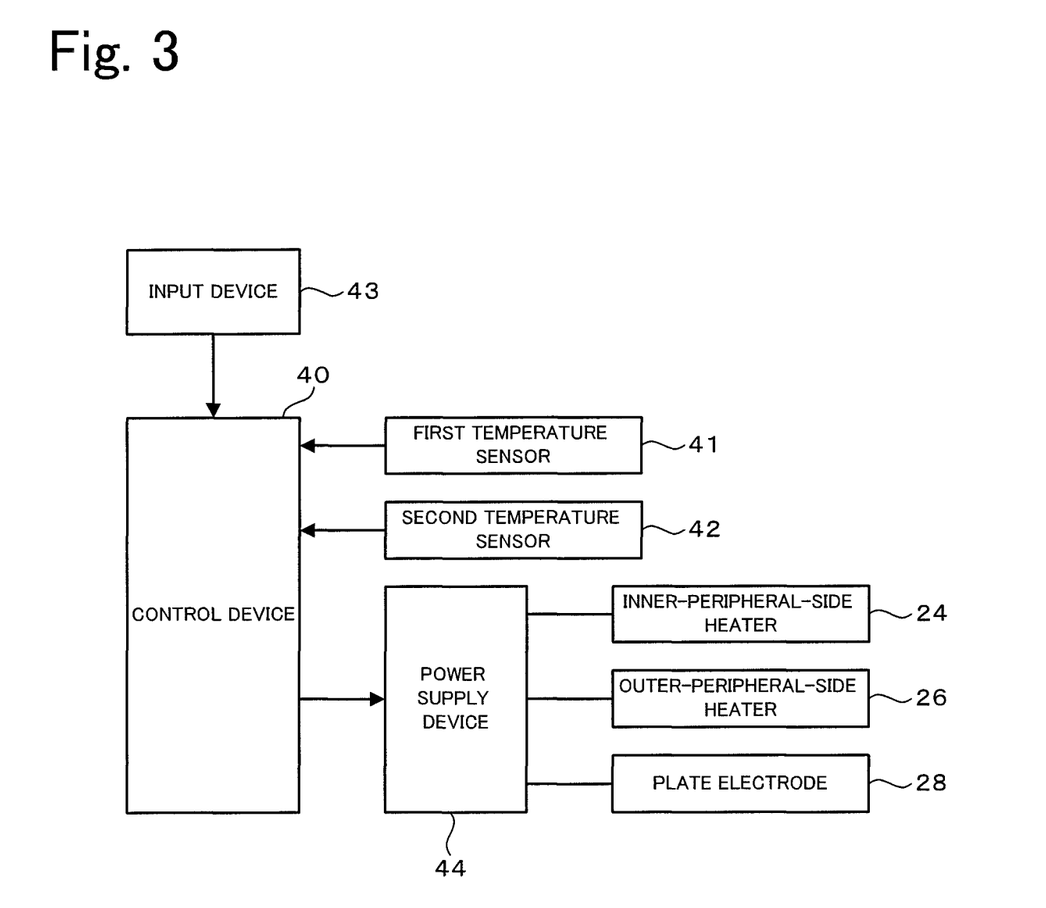
FIG. 3 is a block diagram illustrating electrical connections in a control device 40.

A preferred embodiment of the present invention will be described below with reference to the drawings. FIG. 1 is a vertical sectional view of ancillary equipment 10 for a semiconductor manufacturing apparatus, FIG. 2 is a plan view of a ceramic heater 20, and FIG. 3 is a block diagram illustrating electrical connections in a control device 40.

The ancillary equipment 10 for the semiconductor manufacturing apparatus includes a ceramic heater 20, a shaft 30, and a control device 40.

The ceramic heater 20 includes a disk-shaped ceramic plate 22 with an upper surface defining a wafer placement surface 20a on which a wafer W is to be placed. Here, a diameter of the wafer placement surface 20a is designed to be greater than that of the wafer W. Of the ceramic plate 22, a zone inside a zone boundary line LZ concentric to the ceramic plate 22 is called an inner peripheral zone Ain, and a zone outside the zone boundary line LZ is called an outer peripheral zone Aout. An inner-peripheral-side heater element 24 is embedded in the inner peripheral zone Ain, and an outer-peripheral-side heater element 26 is embedded in the outer peripheral zone Aout. The zone boundary line LZ is a center line (circle) of an annular zone between an outermost peripheral portion of the inner-peripheral-side heater element 24 and an innermost peripheral portion of the outer-peripheral-side heater element 26. A diameter of the zone boundary line LZ is preferably set to a range of 75% or more and 85% or less of a diameter $\phi$ of the ceramic plate 22. Although the diameter $\phi$ of the ceramic plate 22 is not limited to a particular value, it may be set to a range of 330 to 380 mm, for example.

In the ceramic plate 22, a region of the inner peripheral zone Ain near a center provides a shaft joint portion 22a to be joined to the shaft 30. The shaft joint portion 22a is a portion projecting from a surface 20b of the ceramic plate 22 on the opposite side to the wafer placement surface 20a and having a circular columnar shape that is coaxial with the ceramic plate 22. A main plate portion 22b spanning over an entire zone of the ceramic plate 22 outside the shaft joint portion 22a is thinner than the shaft joint portion 22a. The main plate portion 22b is a zone including the zone boundary line LZ and spanning from an outer periphery of the ceramic plate 22 to the inner side beyond the zone boundary line LZ. A thickness t of the main plate portion 22b is 3.9% or less, preferably 3.3% or less, of the diameter $\phi$ of the ceramic plate 22. Furthermore, the thickness t is preferably 1.8% or more of the diameter $\phi$ of the ceramic plate 22.

As illustrated in FIG. 2, the inner-peripheral-side heater element 24 is a resistance line formed in a traversable pattern drawn with one stroke over the entire inner peripheral zone Ain having a circular shape. Terminals 24a and 24b are disposed at opposite ends of the resistance line. Though not illustrated, the terminals 24a and 24b are exposed to an inner space of the shaft 30 from the surface 20b on the opposite side to the wafer placement surface 20a. When a voltage is applied between the terminals 24a and 24b, the inner-peripheral-side heater element 24 produces heat and heats the inner peripheral zone Ain. The outer-peripheral-side heater element 26 is a resistance line formed in a traversable pattern drawn with one stroke over the entire outer peripheral zone Aout having an annular shape. Terminals 26a and 26b are disposed at opposite ends of the resistance line. Though not illustrated, the terminals 26a and 26b are exposed to the inner space of the shaft 30 from the surface 20b on the opposite side to the wafer placement surface 20a. When a voltage is applied between the terminals 26a and 26b, the outer-peripheral-side heater element 26 produces heat and heats the outer peripheral zone Aout. The terminals 24a, 24b, 26a and 26b are disposed in a temperature-boundary inside zone TAin described later. The heater elements 24 and 26 are in the shape of a coil, a ribbon, a mesh, a plate, or a film, and are formed of W, WC, or Mo, for example.

The ceramic plate 22 further incorporates a plate electrode 28, as illustrated in FIG. 1. The plate electrode 28 is embedded between the wafer placement surface 20a and the inner- and outer-peripheral-side heater elements 24 and 26. When a DC voltage is applied to not-illustrated terminals of the plate electrode 28, the wafer W is attracted to and fixedly held on the wafer placement surface 20a by Coulomb force or Johnson-Rahbeck force. When application of the DC voltage is stopped, the wafer W is released from a state attracted to and fixedly held on the wafer placement surface 20a. Thus, the plate electrode 28 is utilized as an electrostatic electrode. The plate electrode 28 is further utilized as an RF electrode when plasma is generated.

A material of the ceramic plate 22 is not limited to particular one, and it may be, for example, aluminum nitride, silicon nitride, boron nitride, SiAlON, alumina, or silicon carbide. Among those examples, aluminum nitride and alumina are preferable because of having high corrosion resistance against corrosive gas, such as halogen-based gas.

The shaft 30 is a cylindrical member and has flanges at upper and lower ends. The flange at the upper end of the shaft 30 is joined to the shaft joint portion 22a of the ceramic plate 22 by brazing or direct joining. Power feed lines (not illustrated) electrically connected to the terminals 24a, 24b, 26a and 26b respectively and power feed lines (not illustrated) electrically connected to the terminals of the plate electrode 28 are arranged inside the shaft 30. The shaft 30 is formed of the same type material as the ceramic plate 22.

The control device 40 incorporates a well-known microcomputer including CPU, ROM, and RAM. As illustrated in FIG. 3, the control device 40 receives not only detection signals from a first temperature sensor 41 measuring a center temperature of the wafer W and a second temperature sensor 42 measuring a outermost periphery temperature of the wafer W, but also commands entered by an operator from an input device 43 (such as a keyboard or a mouse). The control device 40 outputs electric powers to the heater elements 24 and 26 and the plate electrode 28 through a power supply device 44. The power supply device 44 incorporates an AC power supply, a DC power supply, and a radio-frequency power supply. AC voltages are applied to the heater elements 24 and 26 from the AC power supply. To the plate electrode 28, a DC voltage is applied from the DC power supply when the wafer W is to be attracted to the wafer placement surface 20a, and a radio-frequency voltage is applied from the radio-frequency power supply when plasma is to be generated.

A usage example of the above ancillary equipment 10 for the semiconductor manufacturing apparatus is described below. First, the ceramic heater 20 is installed within a not-illustrated vacuum chamber, and the wafer W is placed on the wafer placement surface 20a. Then, the DC voltage is applied to the plate electrode 28 to generate Coulomb force or Johnson-Rahbeck force, thereby attracting and fixedly holding the wafer W onto the wafer placement surface 20a. The inside of the vacuum chamber is depressurized and adjusted to a predetermined degree of vacuum by a vacuum pump. Thereafter, a reaction gas atmosphere under predetermined pressure (e.g., several tens to several hundreds Pa) is formed in the vacuum chamber, and plasma is generated by applying, in such a state, a radio-frequency voltage between an upper electrode within the vacuum chamber and the plate electrode 28 embedded in the ceramic plate 22. A surface of the wafer W is etched by the generated plasma. The control device 40 is previously set to ensure that in a state not under plasma treatment, the center temperature of the wafer W placed on the wafer placement surface 20a becomes a target temperature T, and that the outermost periphery temperature becomes higher than the center temperature by a predetermined temperature difference $\Delta T$ ($>0$). The target temperature T and the predetermined temperature difference $\Delta T$ are set by the operator operating the input device 43. From the viewpoint of preventing a trouble caused by thermal stress, the predetermined temperature difference AT is preferably 10° C. The control device 40 supplies electric power to the inner-peripheral-side heater element 24 such that an output value of the first temperature sensor 41 is kept equal to the target temperature T, and supplies electric power to the outer-peripheral-side heater element 26 such that an output value of the second temperature sensor 42 is kept at a temperature (T+$\Delta T$). In other words, the inner-peripheral-side heater element 24 and the outer-peripheral-side heater element 26 are controlled separately. A temperature rising rate is not limited to a particular value, and it may be set as appropriate within a range up to 40° C./min, for example.

When control is performed such that in the state not under plasma treatment, the center temperature of the wafer W placed on the wafer placement surface 20a becomes the target temperature T and the outermost periphery temperature becomes T+$\Delta T$, as described above, heat drifts from the outer peripheral zone Aout at higher temperature toward the inner peripheral zone Ain at lower temperature. In the case of the thickness t of the main plate portion 22b of the ceramic plate 22 being 5 to 6% of the diameter $\phi$ of the ceramic plate 22, because heat is apt to drift from the outer peripheral zone Aout at higher temperature toward the inner peripheral zone Ain at lower temperature, temperature rises almost linearly from the center of the wafer W toward the outermost periphery. In contrast, in this embodiment, the thickness t of the main plate portion 22b is set to 3.9% or less (preferably 3.3% or less) of the diameter $\phi$ of the ceramic plate 22. By reducing the thickness t of the main plate portion 22b as described above, a cross-sectional area of the main plate portion 22b reduces and heat resistance increases. Hence heat is less apt to drift from the outer peripheral zone Aout at higher temperature toward the inner peripheral zone Ain at lower temperature. As a result, a temperature gradient profile can be obtained in which a temperature distribution in a zone (temperature-boundary inside zone TAin) of the wafer W inside a temperature boundary line LT (see FIG. 1) is nearly flat, and in which a temperature distribution in a zone (temperature-boundary outside zone TAout) of the wafer W outside the temperature boundary line LT gives temperature gradually rising toward the outer periphery. The temperature boundary line LT is a line concentric to the ceramic plate 22, and a diameter of the concentric line is set to, for example, 54.5% of the diameter $\phi$ of the ceramic plate 22. Furthermore, since the thickness of the main plate portion 22b (i.e., the whole zone of the ceramic plate 22 outside the shaft joint portion 22a) is entirely reduced, heat capacity reduces and thermal response becomes more prompt. In addition, since a rear surface of the main plate portion 22b has a smooth shape without any level difference, a surface area is smaller than in the case of including a level difference, and a radiation amount from the rear surface of the main plate portion 22b can be suppressed. Moreover, since a gas flow is less apt to be turbulent, it is possible to avoid the radiation amount from increasing locally, and to prevent generation of a locally cooled portion.

On the other hand, when control is performed such that the center temperature of the wafer W placed on the wafer placement surface 20a in the state not under plasma treatment becomes the target temperature T and the outermost periphery temperature becomes T-$\Delta T$ ($\Delta T>0$), heat is less apt to drift from the inner peripheral zone Ain at higher temperature toward the outer peripheral zone Aout at lower temperature in this embodiment. As a result, a temperature gradient profile can be obtained in which a temperature distribution in the temperature-boundary inside zone TAin of the wafer W is nearly flat, and in which a temperature distribution in the temperature-boundary outside zone TAout gives temperature gradually lowering toward the outer periphery.

With the ceramic heater 20 described in detail above, when the heater elements 24 and 26 are controlled such that the predetermined temperature difference ΔT is held between the center and the outermost periphery of the wafer W placed on the wafer placement surface 20a in the state not under plasma treatment, the temperature gradient profile can be obtained in which the temperature distribution in the temperature-boundary inside zone TAin of the wafer W is nearly flat, and in which the temperature distribution in the temperature-boundary outside zone TAout of the wafer W gives temperature gradually rising (or lowering) toward the outer periphery. As a result, thermal stress in the terminals 24a, 24b, 26a and 26b disposed in the temperature-boundary inside zone TAin reduces significantly, and the ceramic heater 20 is less apt to break.

Furthermore, when the thickness t of the main plate portion 22b is set to 1.8% or more of the diameter ϕ of the ceramic plate 22, sufficient strength of the ceramic heater 20 can be ensured. Accordingly, the ceramic heater 20 can be avoided from being cracked or damaged during use of the ceramic heater 20.

Moreover, when the diameter of the zone boundary line LZ is preferably set to the range of 75% or more and 85% or less of the diameter ϕ of the ceramic plate 22, the temperature distribution in the temperature-boundary inside zone TAin of the wafer W can be made more nearly flat.

It is needless to say that the present invention is not limited to the above-described embodiment, and that the present invention can be implemented in other various embodiments insofar as falling within the technical scope of the invention.

Figure 4:
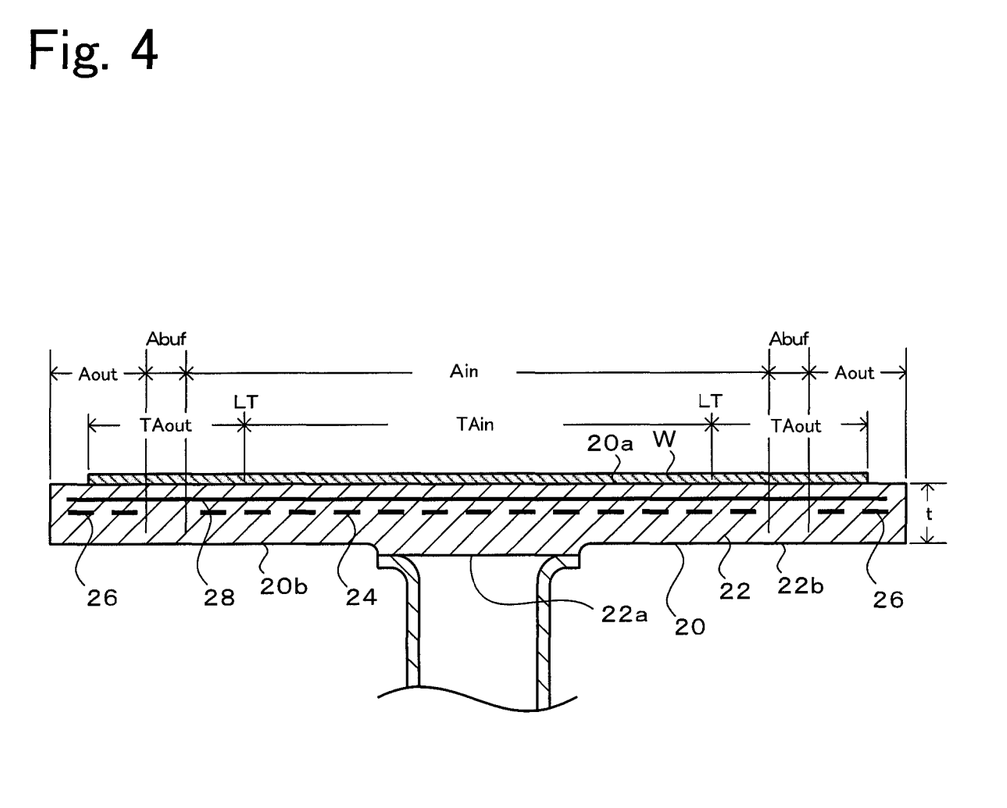
FIG. 4 is a vertical sectional view of the ceramic heater 20 including a buffer zone Abuf.

For instance, as illustrated in FIG. 4, a buffer zone (non-heated zone) Abuf including no heater elements may be provided between the inner peripheral zone Ain and the outer peripheral zone Aout in the ceramic heater 20 of the above-described embodiment. In FIG. 4, the same components as those in the above-described embodiment are denoted by the same reference signs. Because the buffer zone Abuf has large heat resistance, the temperature distribution in the temperature-boundary inside zone TAin of the wafer W is less affected by the outer-peripheral-side heater element 26. Therefore, the temperature distribution in the temperature-boundary inside zone TAin of the wafer W can be made more nearly flat. The buffer zone Abuf is preferably an annular zone having a width in a range of 4.0% or more and 7.6% or less of the diameter ϕ of the ceramic plate 22.

Figure 5:
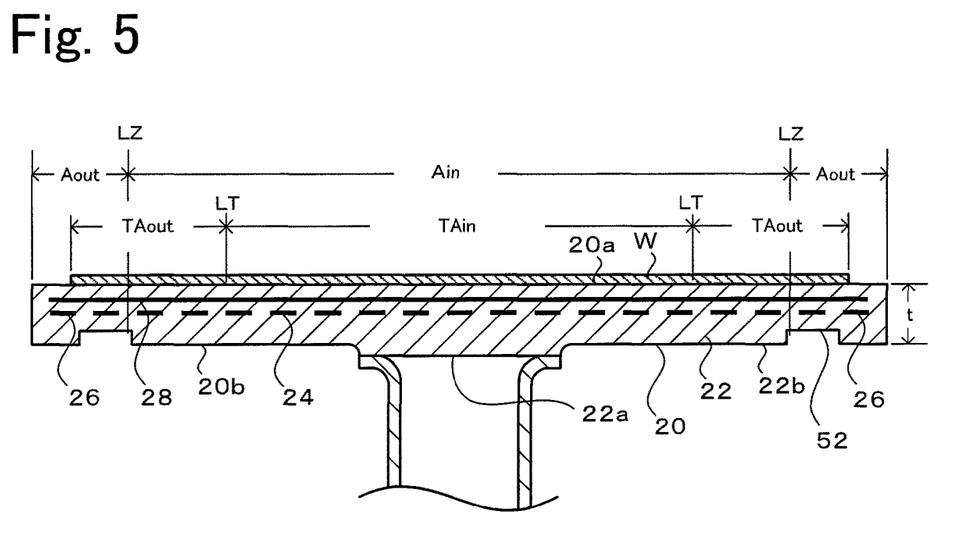
FIG. 5 is a vertical sectional view of the ceramic heater 20 including an annular groove 52.

In the ceramic heater 20 of the above-described embodiment, as illustrated in FIG. 5, a thinned portion including an annular groove 52 may be provided within the outer peripheral zone Aout in the surface 20b of the ceramic plate 22 on the opposite side to the wafer placement surface 20a. In FIG. 5, the same components as those in the above-described embodiment are denoted by the same reference signs. The groove 52 in FIG. 5 is an annular groove concentric to the ceramic plate 22. Although a depth of the groove 52 is not limited to a particular value, it may be, for example, 1.8% or more and 3.3% or less of the diameter ϕ of the ceramic plate 22, or 10% or more and 30% or less of the thickness t of the main plate portion 22b. Although a width of the groove 52 is also not limited to a particular value, it may be, for example, 1% or more and 5% or less of the diameter ϕ of the ceramic plate 22. An inner peripheral edge of the groove 52 may be aligned with the zone boundary line LZ. Because the thinned portion including the groove 52 has large heat resistance, the temperature distribution in the temperature-boundary inside zone TAin of the wafer W is less affected by the outer-peripheral-side heater element 26. The groove 52 may be provided in the non-heated zone including no heater elements. In that case, because the thinned portion including the groove 52 has larger heat resistance, the temperature distribution in the temperature-boundary inside zone TAin of the wafer W is even less affected by the outer-peripheral-side heater element 26.

Figure 6:
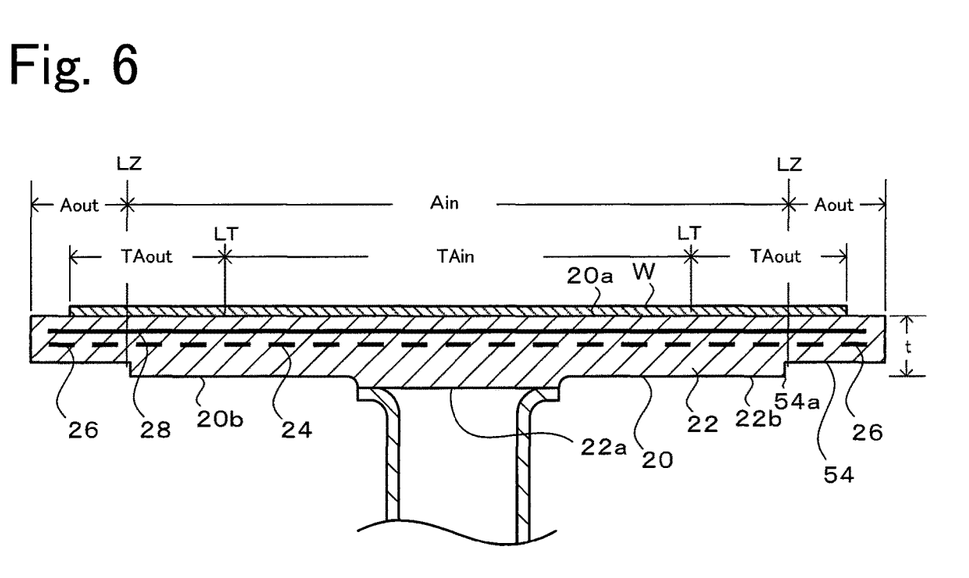
FIG. 6 is a vertical sectional view of the ceramic heater 20 including an annular recessed step 54.

In the ceramic heater 20 of the above-described embodiment, as illustrated in FIG. 6, a thinned portion having an annular recessed step 54 may be provided within the outer peripheral zone Aout in the surface 20b of the ceramic plate 22 on the opposite side to the wafer placement surface 20a. In FIG. 6, the same components as those in the above-described embodiment are denoted by the same reference signs. A recessed-step boundary line 54a of the recessed step 54 in FIG. 6 is concentric to the ceramic plate 22. Although a depth of the recessed step 54 is not limited to a particular value, it may be, for example, 1.8% or more and 3.3% or less of the diameter ϕ of the ceramic plate 22, or 10% or more and 30% or less of the thickness t of the main plate portion 22b. Although a width of the recessed step 54 is also not limited to a particular value, the recessed-step boundary line 54a may be aligned with the zone boundary line LZ. Because the thinned portion including the recessed step 54 has large heat resistance, the temperature distribution in the temperature-boundary inside zone TAin of the wafer W is less affected by the outer-peripheral-side heater element 26. The recessed step 54 may be provided in the non-heated zone including no heater elements. In that case, because the thinned portion including the recessed step 54 has larger heat resistance, the temperature distribution in the temperature-boundary inside zone TAin of the wafer W is even less affected by the outer-peripheral-side heater element 26.

Figure 7:
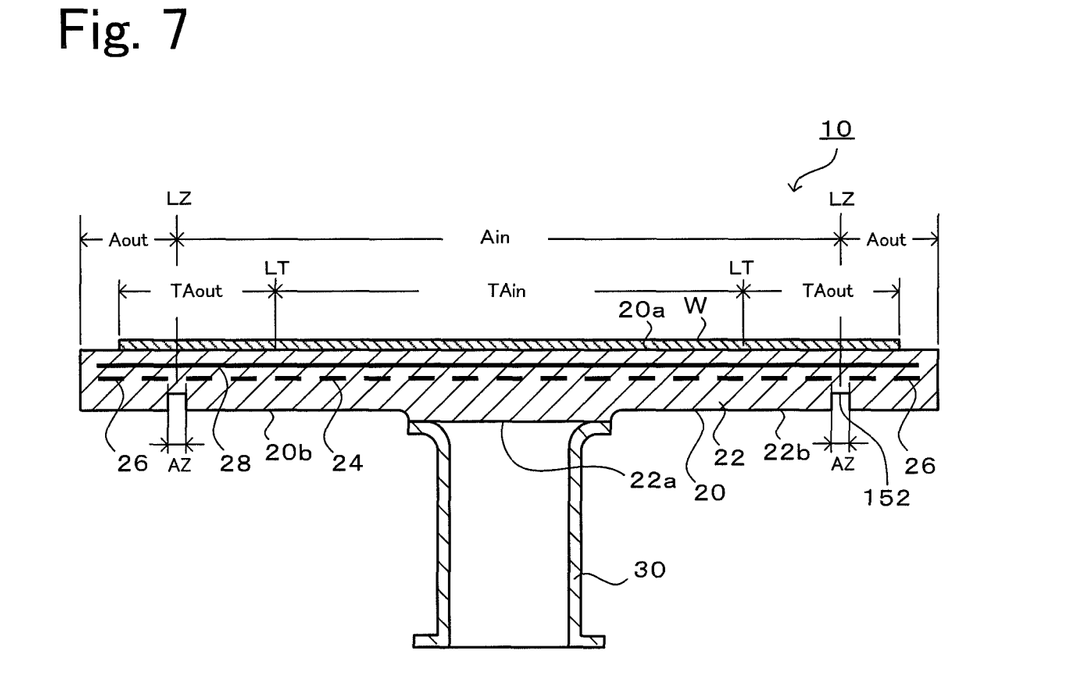
FIG. 7 is a vertical sectional view of a modification of the ceramic heater 20.

In the ceramic heater 20 of the above-described embodiment, as illustrated in FIG. 7, an annular groove 152 may be formed in part of the ceramic plate 22, i.e., in a boundary zone AZ including the zone boundary line LZ. A thickness of the ceramic plate 22 in the boundary zone AZ may be 3.9% or less (preferably 3.3% or less) of the diameter of the ceramic plate 22, and a thickness of the ceramic plate 22 other than the boundary zone AZ may be over 3.9% of the diameter of the ceramic plate 22. In FIG. 7, the same components as those in the above-described embodiment are denoted by the same reference signs. Also in that case, heat is less apt to drift from the outer peripheral zone Aout at higher temperature toward the inner peripheral zone Ain at lower temperature. As a result, in the wafer W placed on the wafer placement surface 20a in the state not under plasma treatment, the temperature gradient profile can be obtained in which the temperature distribution in the zone (temperature-boundary inside zone TAin) of the wafer W inside the temperature boundary line LT is nearly flat, and in which the temperature distribution in the zone (temperature-boundary outside zone TAout) outside the temperature boundary line LT gives temperature gradually rising toward the outer periphery. However, that temperature gradient profile can be more distinctly obtained with the above-described embodiment. The thickness of the ceramic plate 22 in the boundary zone AZ is preferably 1.8% or more of the diameter of the ceramic plate 22 in consideration of the strength.

Figure 8:
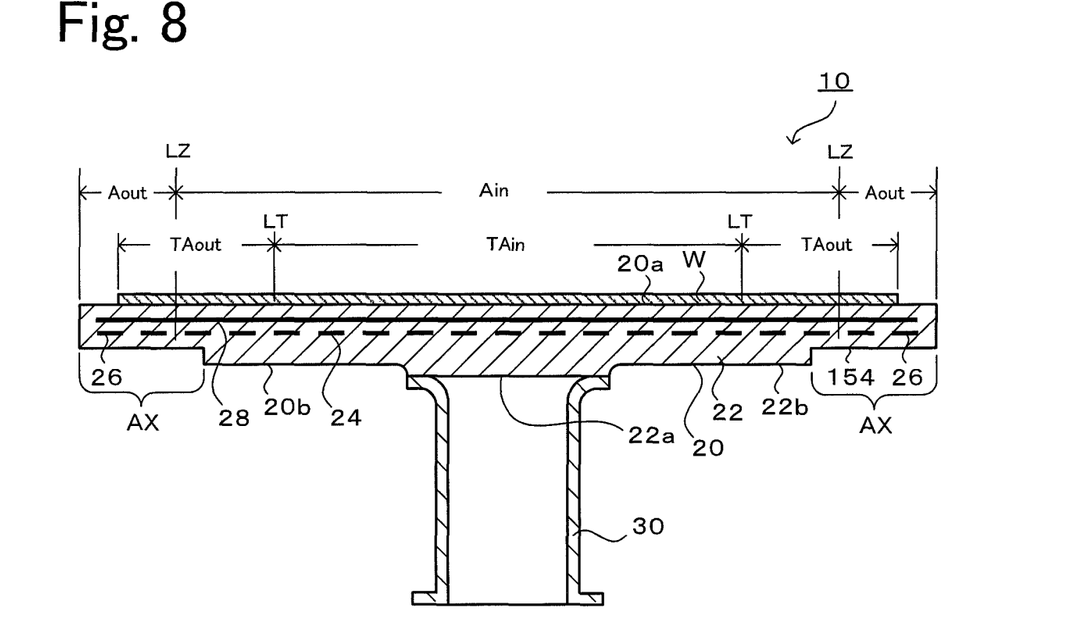
FIG. 8 is a vertical sectional view of a modification of the ceramic heater 20.

In the ceramic heater 20 of the above-described embodiment, as illustrated in FIG. 8, an annular recessed step 154 may be formed in part of the ceramic plate 22, i.e., in a zone AX spanning from the outer periphery toward the inside beyond the zone boundary line LZ. A thickness of the ceramic plate 22 in the zone AX may be 3.9% or less (preferably 3.3% or less) of the diameter of the ceramic plate 22, and a thickness of the ceramic plate 22 other than the zone AX may be over 3.9% of the diameter of the ceramic plate 22. In FIG. 8, the same components as those in the above-described embodiment are denoted by the same reference signs. Also in that case, heat is less apt to drift from the outer peripheral zone Aout at higher temperature toward the inner peripheral zone Ain at lower temperature. As a result, in the wafer W placed on the wafer placement surface 20a in the state not under plasma treatment, the temperature gradient profile in which the temperature distribution in the zone (temperature-boundary inside zone TAin) of the wafer W inside the temperature boundary line LT is nearly flat, and in which the temperature distribution in the zone (temperature-boundary outside zone TAout) outside the temperature boundary line LT gives temperature gradually rising toward the outer periphery can be obtained more distinctly than in the case of FIG. 7. However, that temperature gradient profile can be more distinctly obtained with the above-described embodiment. The thickness of the ceramic plate 22 in the zone spanning from the outer periphery toward the inside beyond the zone boundary line LZ is preferably 1.8% or more of the diameter of the ceramic plate 22 in consideration of the strength.

While the above-described embodiment has the structure that the plate electrode 28 is embedded in the ceramic plate 22, a structure of not including the embedded plate electrode 28 may be used. While, in the above-described embodiment, the plate electrode 28 serves as both of the electrostatic electrode and the RF electrode, it may serve as one of the electrostatic electrode and the RF electrode. Alternatively, the electrostatic electrode and the RF electrode may be separately embedded in the ceramic plate 22.

While, in the above-described embodiment, the thickness of the shaft joint portion 22a of the ceramic plate 22 is set greater than the thickness t of the main plate portion 22b around the shaft joint portion 22a, the thickness of the shaft joint portion 22a may be the same as that of the main plate portion 22b.

EXAMPLES

Experimental Example 1

In Experimental Example 1, the ceramic heater 20 of FIG. 1 was fabricated. However, the plate electrode 28 was omitted. More specifically, a plate having a diameter ϕ of 330 mm (radius r of 165 mm) and made of an aluminum-nitride sintered body was used as the ceramic plate 22. The zone boundary line LZ was a circle having a diameter of 260 mm (79% of the diameter ϕ of the ceramic plate 22) and was concentric to the ceramic plate 22. The diameter of the shaft joint portion 22a was 74 mm, and the thickness of the shaft joint portion 22a was 18 mm. The thickness t of the main plate portion 22b was 13 mm (ratio of the thickness t/the diameter ϕ being 3.9%). The heater elements 24 and 26 were each in the form of a molybdenum-made coil spring. A table of FIG. 9 indicates the dimensions of the ceramic plate 22 used in Experimental Example 1.

Figure 10:
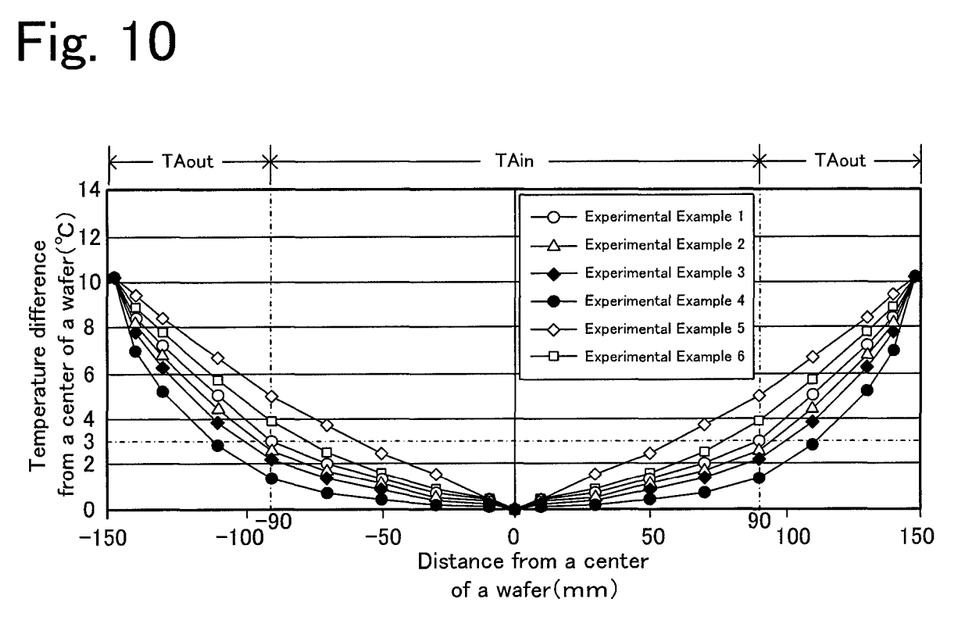
FIG. 10 plots temperature gradient profiles in Experimental Examples 1 to 6.

With the aid of the control device 40, in the state not under plasma treatment, the center temperature of the wafer W placed on the wafer placement surface 20a was set to the target temperature T (600° C. here), and the outermost periphery temperature of the wafer W was set to be higher than the center temperature by the predetermined temperature difference ΔT (10° C. here). At a time when the center temperature and the outer periphery temperature of the wafer W reached the setting temperatures, temperatures were measured at eight positions in a region from the center to the right end of the wafer W along the diameter (i.e., a region of distance from the wafer center being 0 to 150 mm), and at eight positions in a region from the center to the other end (i.e., a region of distance from the wafer center being 0 to −150 mm). A graph of FIG. 10 plots the measured results. The temperature boundary line LT was set to a circle having a diameter of 180 mm (concentric to the ceramic plate 22, 54.5% of the diameter ϕ of the ceramic plate 22 and spaced from the center through a distance of 90 mm).

In Experimental Example 1, in the state not under plasma treatment, the difference between the center temperature of the wafer W placed on the wafer placement surface 20a and the temperature at the temperature boundary line LT was 3.0° C., and the evaluation result was good. Here, when the above difference was 3.0° C. or less, the evaluation result was regarded as good because thermal stress in the terminal portion was sufficiently small, and when it was over 3.0° C., the evaluation result was regarded as not good. The temperature gradient profile in Experimental Example 1 was as per plotted in FIG. 10. Thus, the temperature distribution in the temperature-boundary inside zone TAin was nearly flat, and the temperature distribution in the temperature-boundary outside zone TAout gave temperature gradually rising toward the outer periphery.

Experimental Example 2

Figure 9:
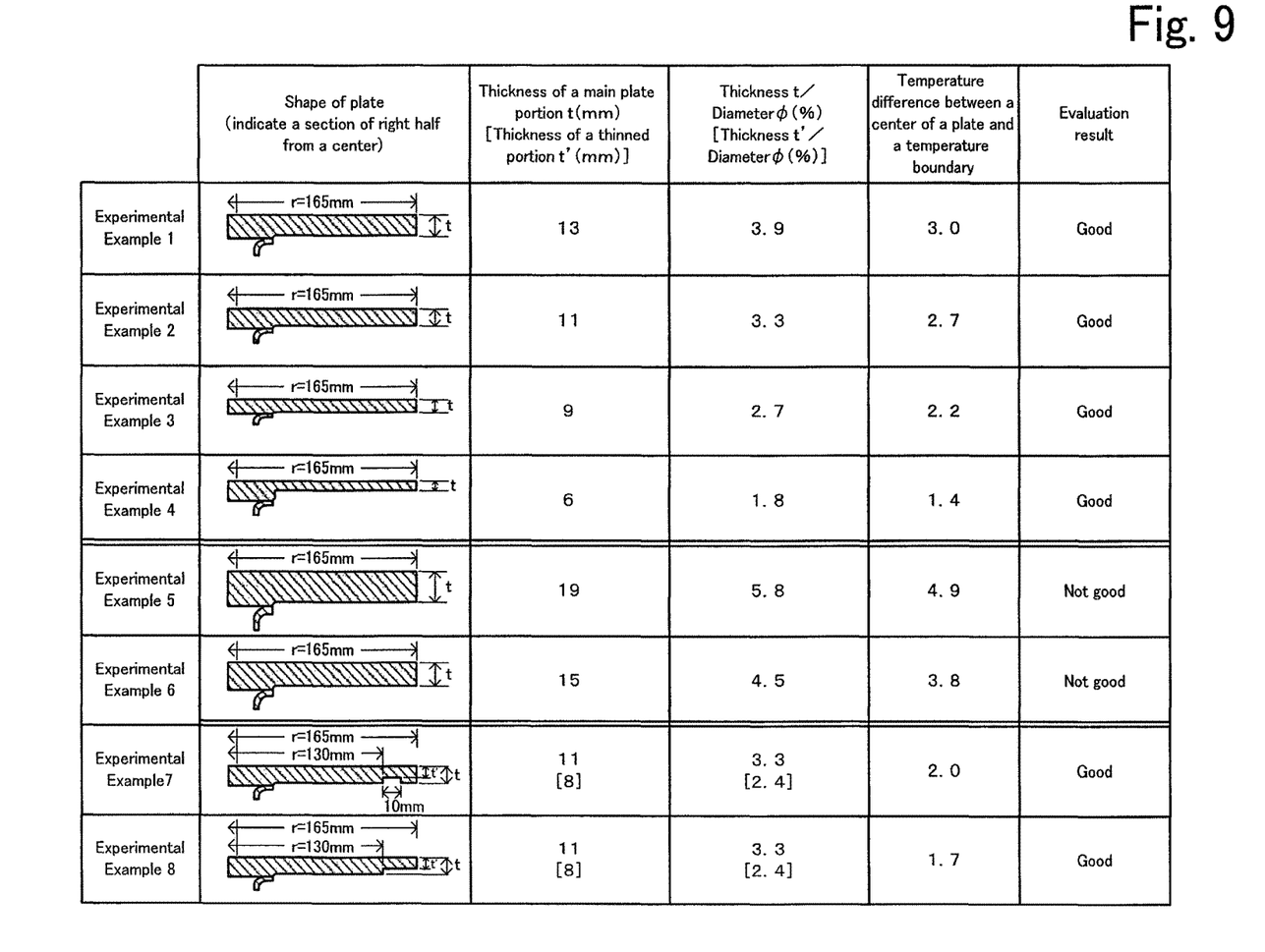
FIG. 9 is a table listing dimensions and temperature measurement results in Experimental Examples 1 to 8.

In Experimental Example 2, the ceramic heater 20 was fabricated in a similar manner to that in Experimental Example 1 except for setting the thickness t of the main plate portion 22b to 11 mm (ratio of the thickness t/the diameter ϕ being 3.3%), and temperature measurement was performed in a similar manner to that in Experimental Example 1. The obtained results are indicated in the table of FIG. 9 and the graph of FIG. 10. In Experimental Example 2, in the state not under plasma treatment, the difference between the center temperature of the wafer W placed on the wafer placement surface 20a and the temperature at the temperature boundary line LT was 2.7° C. (≤3.0° C.), and the evaluation result was good. The temperature gradient profile in Experimental Example 2 was as per plotted in FIG. 10. Thus, the temperature distribution in the temperature-boundary inside zone TAin was more nearly flat than that in Experimental Example 1, and the temperature distribution in the temperature-boundary outside zone TAout gave temperature gradually rising toward the outer periphery.

Experimental Example 3

In Experimental Example 3, the ceramic heater 20 was fabricated in a similar manner to that in Experimental Example 1 except for setting the thickness t of the main plate portion 22b to 9 mm (ratio of the thickness t/the diameter ϕ being 2.7%), and temperature measurement was performed in a similar manner to that in Experimental Example 1. The obtained results are indicated in the table of FIG. 9 and the graph of FIG. 10. In Experimental Example 3, in the state not under plasma treatment, the difference between the center temperature of the wafer W placed on the wafer placement surface 20a and the temperature at the temperature boundary line LT was 2.2° C. (≤3.0° C.), and the evaluation result was good. The temperature gradient profile in Experimental Example 3 was as per plotted in FIG. 10. Thus, the temperature distribution in the temperature-boundary inside zone TAin was more nearly flat than those in Experimental Examples 1 and 2, and the temperature distribution in the temperature-boundary outside zone TAout gave temperature gradually rising toward the outer periphery.

Experimental Example 4

In Experimental Example 4, the ceramic heater 20 was fabricated in a similar manner to that in Experimental Example 1 except for setting the thickness t of the main plate portion 22b to 6 mm (ratio of the thickness t/the diameter ϕ being 1.8%), and temperature measurement was performed in a similar manner to that in Experimental Example 1. The obtained results are indicated in the table of FIG. 9 and the graph of FIG. 10. In Experimental Example 4, in the state not under plasma treatment, the difference between the center temperature of the wafer W placed on the wafer placement surface 20a and the temperature at the temperature boundary line LT was 1.4° C. (≤3.0° C.), and the evaluation result was good. The temperature gradient profile in Experimental Example 4 was as per plotted in FIG. 10. Thus, the temperature distribution in the temperature-boundary inside zone TAin was more nearly flat than those in Experimental Examples 1 to 3, and the temperature distribution in the temperature-boundary outside zone TAout gave temperature gradually rising toward the outer periphery.

In any of Experimental Examples 1 to 4, the thickness t of the main plate portion 22b is 3.9% or less of the diameter of the ceramic plate 22, it is preferable to reduce the thickness t from the viewpoint of more distinctly providing the tendency that the temperature distribution in the temperature-boundary inside zone TAin is more nearly flat, and that the temperature distribution in the temperature-boundary outside zone TAout gives temperature gradually rising toward the outer periphery.

Experimental Example 5

In Experimental Example 5, the ceramic heater 20 was fabricated in a similar manner to that in Experimental Example 1 except for setting the thickness t of the main plate portion 22b to 19 mm (ratio of the thickness t/the diameter ϕ being 5.8%), and temperature measurement was performed in a similar manner to that in Experimental Example 1. The obtained results are indicated in the table of FIG. 9 and the graph of FIG. 10. In Experimental Example 5, in the state not under plasma treatment, the difference between the center temperature of the wafer W placed on the wafer placement surface 20a and the temperature at the temperature boundary line LT was 4.9° C. (>3.0° C.), and the evaluation result was no good. The temperature gradient profile in Experimental Example 5 gave temperature almost linearly rising from the center of the wafer W toward the outermost periphery, as per plotted in FIG. 10.

Experimental Example 6

In Experimental Example 6, the ceramic heater 20 was fabricated in a similar manner to that in Experimental Example 1 except for setting the thickness t of the main plate portion 22b to 15 mm (ratio of the thickness t/the diameter ϕ being 4.5%), and temperature measurement was performed in a similar manner to that in Experimental Example 1. The obtained results are indicated in the table of FIG. 9 and the graph of FIG. 10. In Experimental Example 6, in the state not under plasma treatment, the difference between the center temperature of the wafer W placed on the wafer placement surface 20a and the temperature at the temperature boundary line LT was 3.8° C. (>3.0° C.), and the evaluation result was no good. The temperature gradient profile in Experimental Example 6 gave temperature almost linearly rising from the center of the wafer W toward the outermost periphery, as per plotted in FIG. 10.

Experimental Example 7

Figure 11:
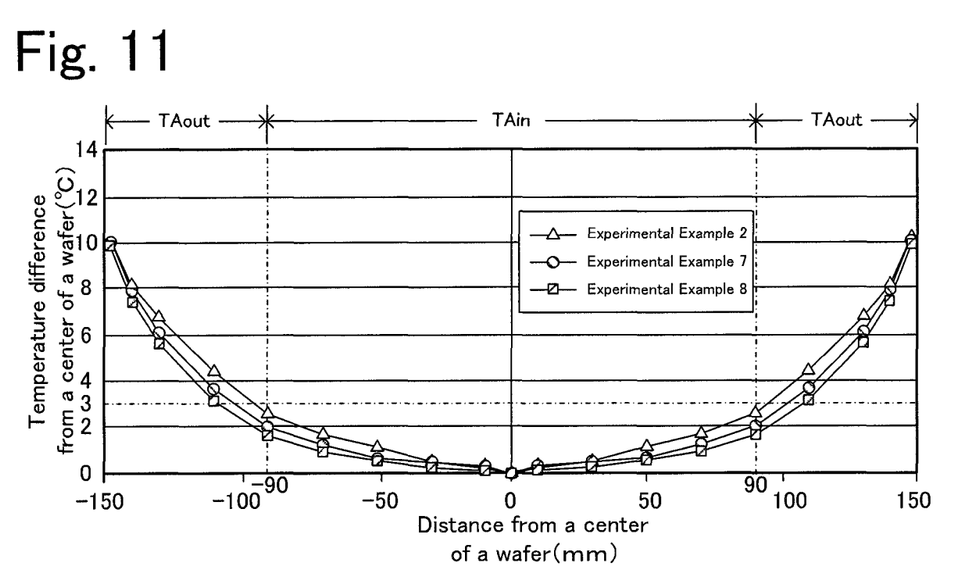
FIG. 11 plots temperature gradient profiles in Experimental Examples 2, 7 and 8.

In Experimental Example 7, the ceramic heater 20 was fabricated in a similar manner to that in Experimental Example 2 except for providing, within the outer peripheral zone Aout, the thinned portion (see FIG. 5) including the annular groove 52 in the surface 20b of the ceramic plate 22 on the opposite side to the wafer placement surface 20a, and temperature measurement was performed in a similar manner to that in Experimental Example 2. The inner peripheral edge of the groove 52 was a circle having a diameter of 260 mm and was aligned with the zone boundary line LZ. The depth of the groove 52 was 3 mm, the width of the groove 52 was 10 mm, and the thickness t' of the thinned portion was 8 mm. The obtained results are indicated in the table of FIG. 9 and a graph of FIG. 11. In Experimental Example 7, in the state not under plasma treatment, the difference between the center temperature of the wafer W placed on the wafer placement surface 20a and the temperature at the temperature boundary line LT was 2.0° C., and the evaluation result was good. The temperature gradient profile in Experimental Example 7 was as per plotted in FIG. 11. Thus, the temperature distribution in the temperature-boundary inside zone TAin was more nearly flat than that in Experimental Example 2 not including the groove 52, and the temperature distribution in the temperature-boundary outside zone TAout gave temperature gradually rising toward the outer periphery.

Experimental Example 8

In Experimental Example 8, the ceramic heater 20 was fabricated in a similar manner to that in Experimental Example 2 except for providing, within the outer peripheral zone Aout, the thinned portion (see FIG. 6) including the annular recessed step 54 in the surface 20b of the ceramic plate 22 on the opposite side to the wafer placement surface 20a, and temperature measurement was performed in a similar manner to that in Experimental Example 2. The recessed-step boundary line 54a of the recessed step 54 was a circle having a diameter of 260 mm and was aligned with the zone boundary line LZ. The depth of the recessed step 54 was 3 mm, and the thickness t' of the thinned portion was 8 mm. The obtained results are indicated in the table of FIG. 9 and the graph of FIG. 11. In Experimental Example 8, in the state not under plasma treatment, the difference between the center temperature of the wafer W placed on the wafer placement surface 20a and the temperature at the temperature boundary line LT was 1.7° C., and the evaluation result was good. The temperature gradient profile in Experimental Example 8 was as per plotted in FIG. 11. Thus, the temperature distribution in the temperature-boundary inside zone TAin was more nearly flat than those in Experimental Example 2 not including the recessed step 54 and Experimental Example 7 including the groove 52, and the temperature distribution in the temperature-boundary outside zone TAout gave temperature gradually rising toward the outer periphery.

Experimental Example 9

In Experimental Example 9, the ceramic heater 20 was fabricated in a similar manner to that in Experimental Example 6 except for providing, within the outer peripheral zone Aout, the thinned portion (see FIG. 7) including the annular groove 152 in the surface 20b of the ceramic plate 22 on the opposite side to the wafer placement surface 20a, and temperature measurement was performed in a similar manner to that in Experimental Example 6. The inner peripheral edge of the groove 152 was a circle having a diameter of 215 mm. The depth of the groove 152 was 5 mm, the width of the groove 152 was 32.5 mm, and the thickness t' of the thinned portion was 10 mm. The obtained results are indicated in a table of FIG. 12 and a graph of FIG. 13. In Experimental Example 9, in the state not under plasma treatment, the difference between the center temperature of the wafer W placed on the wafer placement surface 20a and the temperature at the temperature boundary line LT was 3.0° C., and the evaluation result was good. The temperature gradient profile in Experimental Example 9 was as per plotted in FIG. 13. Thus, the temperature distribution in the temperature-boundary inside zone TAin was more nearly flat than that in Experimental Example 6 not including the groove 152, and the temperature distribution in the temperature-boundary outside zone TAout gave temperature gradually rising toward the outer periphery.

Experimental Example 10

Figure 12:
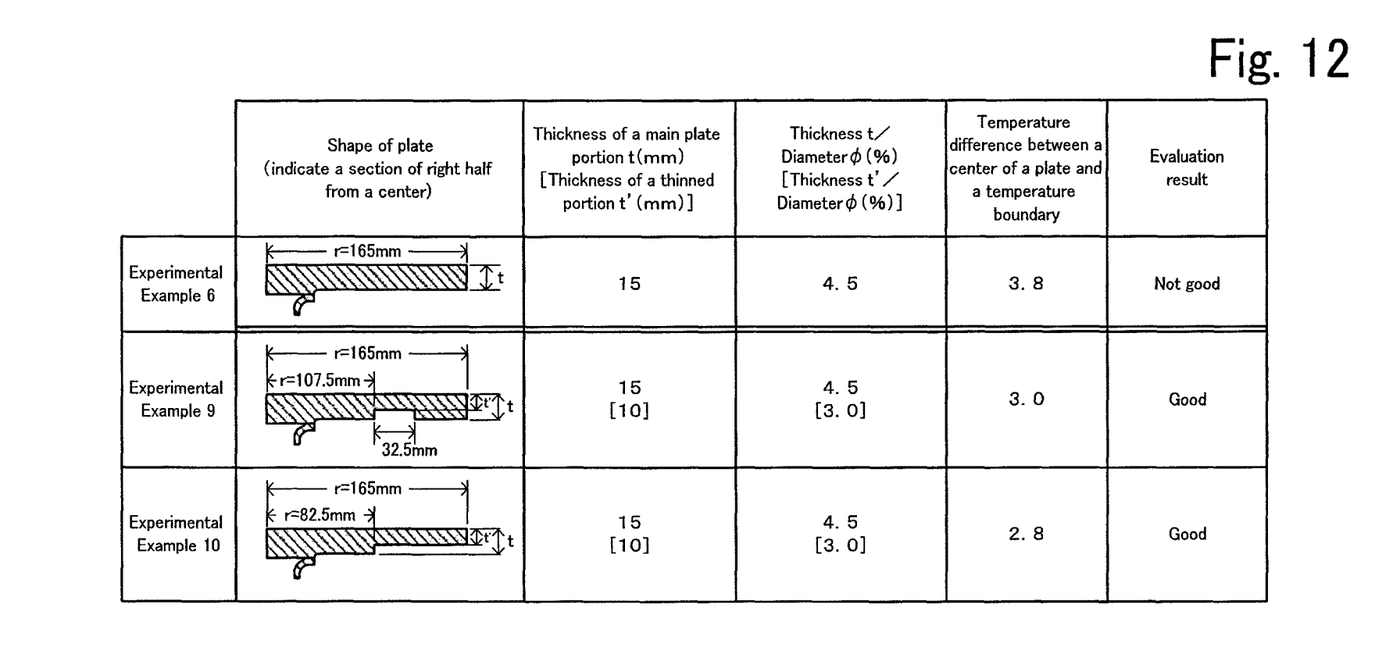
FIG. 12 is a table listing dimensions and temperature measurement results in Experimental Examples 6, 9 and 10.
Figure 13:
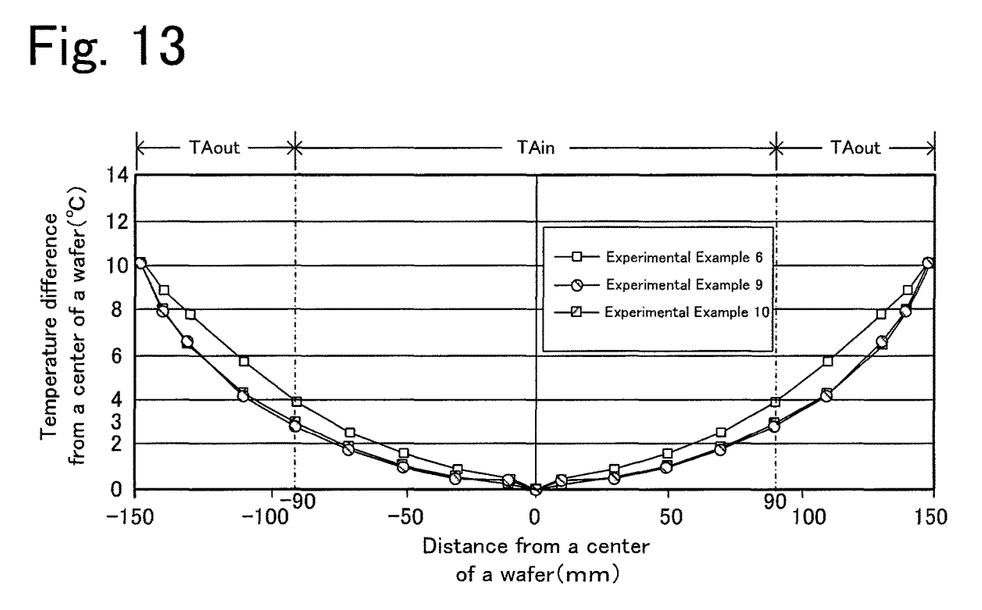
FIG. 13 plots temperature gradient profiles in Experimental Examples 6, 9 and 10.

In Experimental Example 10, the ceramic heater 20 was fabricated in a similar manner to that in Experimental Example 6 except for providing, within the outer peripheral zone Aout, the thinned portion (see FIG. 8) including the annular recessed step 154 in the surface 20b of the ceramic plate 22 on the opposite side to the wafer placement surface 20a, and temperature measurement was performed in a similar manner to that in Experimental Example 6. A recessed-step boundary line of the recessed step 154 was a circle having a diameter of 165 mm. The depth of the recessed step 154 was 5 mm, and the thickness t' of the thinned portion was 10 mm. The obtained results are indicated in the table of FIG. 12 and the graph of FIG. 13. In Experimental Example 10, in the state not under plasma treatment, the difference between the center temperature of the wafer W placed on the wafer placement surface 20a and the temperature at the temperature boundary line LT was 2.8° C., and the evaluation result was good. The temperature gradient profile in Experimental Example 10 was as per plotted in FIG. 13. Thus, the temperature distribution in the temperature-boundary inside zone TAin was more nearly flat than that in Experimental Example 6 not including the recessed step 154, and the temperature distribution in the temperature-boundary outside zone TAout gave temperature gradually rising toward the outer periphery.

Of Experimental Examples 1 to 10, Experimental Examples 1 to 4 and 7 to 10 correspond to Examples of the present invention, and Experimental Examples 5 and 6 correspond to Comparative Examples. It is to be noted that those Experimental Examples in no way restrict the scope of the present invention.

What is claimed is:

1. A ceramic heater comprising a disk-shaped ceramic plate with an upper surface defining a wafer placement surface on which a wafer is to be placed, one or more inner-peripheral-side heater elements embedded in an inner peripheral zone of the ceramic plate, and one or more outer-peripheral-side heater elements embedded in an outer peripheral zone of the ceramic plate, with the ceramic plate having a shaft joint portion, which is joined to a shaft, the shaft joint portion is provided in a region of the inner peripheral zone near a center such that a predetermined zone is an entire zone of the ceramic plate outside the shaft joint portion, wherein
  a thickness of the shaft joint portion is greater than a thickness of the ceramic plate in the predetermined zone, and the thickness of the ceramic plate in the predetermined zone is 3.9% or less of a diameter of the ceramic plate,
  the predetermined zone is a zone including a zone boundary line between the inner peripheral zone and the outer peripheral zone such that the zone boundary line is a circle concentric to the ceramic plate, and a diameter of the concentric circle is set to a range of 75 to 85% of the diameter of the ceramic plate, and
  the ceramic heater further comprises, one of (i) an annular groove having an inner peripheral edge and an annular width that is 1 to 5% of the diameter of the ceramic plate, such that the inner peripheral edge is aligned with the zone boundary line, with the annular groove being concentric to the ceramic plate and having a depth that is 10 to 30% less than the thickness of the predetermined zone, or (ii) an annular recessed step having an inner peripheral edge that is aligned with the zone boundary line, such that the annular recessed step extends from the zone boundary line to the outermost edge of the diameter of the ceramic plate, with the annular recessed step being concentric to the ceramic plate and having a depth that is 10 to 30% less than the thickness of the predetermined zone.

2. The ceramic heater according to claim 1, wherein the predetermined zone is a zone spanning from an outer periphery of the ceramic plate to an inner side beyond the zone boundary line.

3. The ceramic heater according to claim 1, wherein the thickness of the ceramic plate in the predetermined zone is 3.3% or less of the diameter of the ceramic plate.

4. The ceramic heater according to claim 1, wherein the thickness of the ceramic plate in the predetermined zone is 1.8% or more of the diameter of the ceramic plate.

5. The ceramic heater according to claim 1, wherein a non-heated zone including no heater elements is provided between the inner peripheral zone and the outer peripheral zone.

6. The ceramic heater according to claim 5, wherein the non-heated zone is an annular zone having a width in a range of 4.0% or more and 7.6% or less of the diameter of the ceramic plate.

* * * * *